United States Patent
America et al.

(10) Patent No.: US 7,129,159 B2
(45) Date of Patent: Oct. 31, 2006

(54) INTEGRATED DUAL DAMASCENE RIE PROCESS WITH ORGANIC PATTERNING LAYER

(75) Inventors: William G. America, Kingston, NY (US); Steven H. Johnston, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 121 days.

(21) Appl. No.: 10/921,007

(22) Filed: Aug. 17, 2004

(65) Prior Publication Data

US 2006/0040501 A1    Feb. 23, 2006

(51) Int. Cl.
*H01L 21/4763*    (2006.01)

(52) U.S. Cl. ............ 438/618; 438/622; 438/623; 438/725

(58) Field of Classification Search .......... None
See application file for complete search history.

(56) References Cited

U.S. PATENT DOCUMENTS

| | | | |
|---|---|---|---|
| 6,211,061 B1 * | 4/2001 | Chen et al. ........ | 438/622 |
| 6,448,176 B1 | 9/2002 | Grill et al. | |
| 6,767,825 B1 * | 7/2004 | Wu .................. | 438/633 |
| 2003/0089990 A1 * | 5/2003 | Usami ............. | 257/758 |
| 2003/0219973 A1 * | 11/2003 | Townsend et al. ...... | 438/631 |
| 2005/0110145 A1 * | 5/2005 | Elers ................ | 257/758 |

* cited by examiner

*Primary Examiner*—Duy-Vu N Deo
(74) *Attorney, Agent, or Firm*—Graham S. Jones, II; H. Daniel Schnurmann

(57) ABSTRACT

A dual damascene conductor structure is formed on a substrate with an exposed conductor on top covered by a buried cap, a dielectric layer (DL) and an organic layer (OL). Form a lower via hard mask layers over the OL and form a top trench patterning hard mask over the lower, via hard mask. Form a trench pattern hole through the trench hard mask layer; and form a via pattern hole through the via hard mask layer in a region exposed below the trench pattern hole. Etch a via pattern hole into the OL and then etch a via pattern hole down into the DL. Etch away the trench pattern layer and the OL layer below the trench pattern hole. Etch the via hole through the DL exposing the cap while simultaneously partially etching the DL to a final trench depth to form a trench in the DL below the trench pattern hole, with the trench having a bottom above the cap and sidewalls in the DL.

20 Claims, 8 Drawing Sheets

INTEGRATED DUAL DAMASCENE RIE PROCESS WITH ORGANIC PATTERNING LAYER

BACKGROUND OF THE INVENTION

This invention relates to semiconductor devices and more particularly to methods of Form interconnections between conductors in such devices.

As is well understood by those skilled in the art of manufacture of semiconductor devices photoresist masking layers are used for patterning vias and trenches by photolithography. As the Critical Dimensions (CDs) of vias and trenches for advanced semiconductor devices continue to become smaller and the photoresist masking layers used for patterning the vias and trenches become thinner. The thickness of an intermediate layer known as a low k Inter-Level Dielectric (ILD) layer may not scale down in proportion to the photoresist masking layers.

A preferred method for manufacture of metal interconnects is to form a Damascene structure. Damascene wiring interconnects are formed by depositing an Inter-Layer Dielectric (ILD) layer on a planar surface. Then the ILD layer is patterned using lithography to form trenches by a subtractive processing method such as Reactive Ion Etching (RIE). Then the trenches in the ILD layer are filled with conductive metal. The excess metal is removed by a method such as Chemical Mechanical Polishing (CMP), while the trenches remain filled with the metal.

In the dual damascene process, illustrated by commonly assigned U.S. Pat. No. 6,737,747 of Barth et al. entitled "Advanced BEOL Interconnect Structures with Low-k PE CVD Cap Layer and Method Thereof" one or more sets of monolithic via/conductor structure(s) is(are) formed from the repeated patterning of the ILD layer (which in Barth is a low-k dielectric) followed by metal filling and CMP. First, a relatively thick ILD layer is deposited on a planar surface. The ILD thickness is slightly larger than the desired final thickness of the vias and wire, since a small amount of oxide is removed during CMP. Via holes are formed in the oxide using photolithography and RIE that etches through the dielectric stopping on the underlying metal to be contacted. The trenches can then be formed using a separate photolithography step and a timed ILD etching step.

In the past creating a dual damascene via within a trench by a dry etching process, e.g. RIE, has required performing separate steps to form the via and the trench. Furthermore, as it has been necessary to employ photolithography to print smaller features, tit has been necessary to thin the photoresist to a point at which the remaining thickness thereof is insufficient to withstand the duration of the ILD etching step while retaining the critical dimensions. If one were to employ separate via and trench processing steps that would have the disadvantage of imposing the burden of requiring greater total processing time for dual-damascene formation.

In practice, in many cases dielectric materials, based on methyl substituted siloxanes are used, and the stripping process from the via and trench steps increases the damage to the exposed dielectric removing methylene groups near the surface of the dielectric layers and increasing the dielectric strength of the low k ILD layer. Any process step that removes the $CH_3$ or $CH_2$ groups of the low k ILD increases the silica like properties and increases the dielectric strength. The extent of damage to the low k ILD is a function of the etch chemistry and the stripping chemistry and also the duration. When the "via first" or "trench first" processes are used the time during which the vias or trenches are exposed to the stripping plasma doubles.

SUMMARY OF THE INVENTION

Combining the above process into the integrated via/trench process described herein reduces the stripping time for the trench and via. During a "via first" process the vias are formed and the resist is stripped. Next a planarizing layer of organic polymer (photoresist like material) is applied filling the vias and forming a flat planar layer over the ILD. A resist layer and an ARC layer are applied and the step of trench etching is carried out. The trench pattern is transferred into the low k ILD through the excess planarizing layer and into the low k ILD. When the trenches are etched to the correct depth the excess organic material in the bottom portion of the via needs to be stripped out along with any remaining resist, so the via sees 2× strip.

In accordance with this invention an ILD layer is formed over a planar substrate which is covered with a buried cap layer which is provided as a diffusion barrier between copper and adjacent dielectric layers. An Organic Layer (OL) is formed as an intermediate sacrificial masking layer above locations where a future trench area is to be formed during formation of vias the ILD layer. Before the vias are patterned in a photoresist process, the ILD layer is coated with the Organic Layer (OL) which is composed of material onto which a thin layer of a lower, via hard mask layer, preferably composed of Low Temperature Silicon Oxide (LTO) has been deposited. A top, trench hard mask layer of SiC or $Si_3N_4$, etc. is deposited over the lower, via hard mask (LTO) layer. Then the top, trench hard mask layer, but not the lower, hard mask (LTO) layer, is patterned through a photolithographic trench patterning process to form a trench mask. The trench mask is patterned by forming an ARC layer and a photoresist mask followed by a subtractive process such as RIE to a trench opening defining the region in which trenches are to be formed with portions of the ILD layer exposed where a trench is to be formed after forming via openings in the ILD layer exposing a portion of the lower, via hard mask layer.

Then after the trench mask has been patterned a supplemental ARC layer and a patterned photoresist via mask are formed over the trench mask and the exposed portion of the lower, via hard mask layer. The photoresist via mask is formed for etching vias through the layers therebelow in a multi-step process. Next, via openings are etched through the ARC layer and lower, via hard mask layer within the trench opening by employing an RIE step to etch through the ARC layer, within the trench opening in the top, trench hard mask layer and the lower, via hard mask (LTO) layer and into the top of the OL layer.

At this point, an option is that the photoresist mask and the ARC layer may be stripped, but it is preferred that they remain.

Next the RIE conditions are changed, so that the OL layer is etched and any remaining portion of the photoresist via mask is etched away in the process. As a result, portions of the top surface of the ILD layer below the via holes are partially etched. In any event, at this point, the photoresist via mask has been stripped and via holes have been etched through the OL layer into the ILD layer.

Next, the ARC layer is etched away revealing the trench mask, which is in turn etched away, thereby exposing the surface of the OL layer into which the trench is to be etched.

Then the trench pattern is etched through the OL layer

The etch conditions are changed so the SiC and LTO layers are removed by etching and the trench is etched into the ILD layer as well. During the time the trench is etched the vias are completed. Optimizing the partial via time and trench etch time will complete etching of the trench to its desired depth after the vias are fully formed.

Preferably, the ILD layer is formed above a buried cap layer formed on the top surface of a silicon semiconductor substrate in which a copper patterned layer is formed. The vias connect to the copper patterned layer at points required by the design of the product being manufactured. Then a buried cap layer on the surface of the substrate is etched and the organic layer is removed completing the process.

Thereafter, the trench and the vias are filled with Damascene conductor structures as is well understood by those skilled in the art.

The invention and objects and features thereof will be more readily apparent from the following detailed description and appended claims when taken with the drawings.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1A:
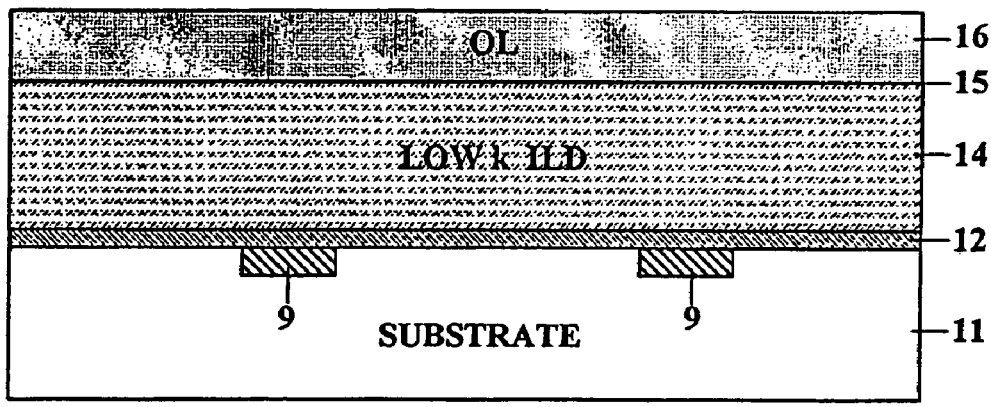
FIGS. 1A–1N illustrate a preferred embodiment of process of manufacture of a device 10 in accordance with the method of this invention.
Figure 1B:
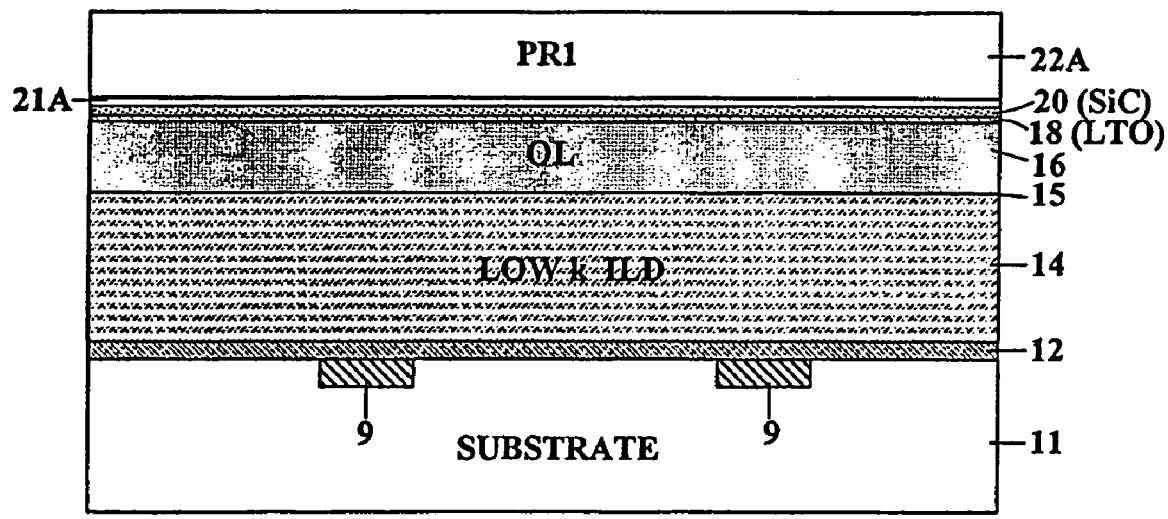
Figure 1C:
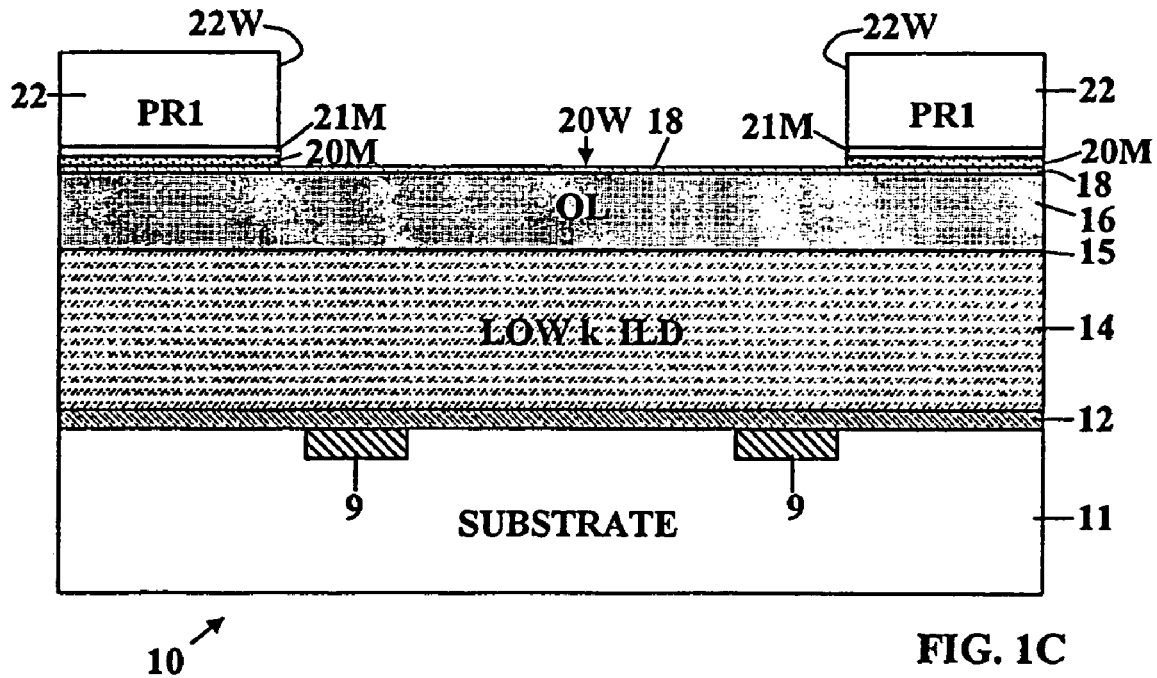
Figure 1D:
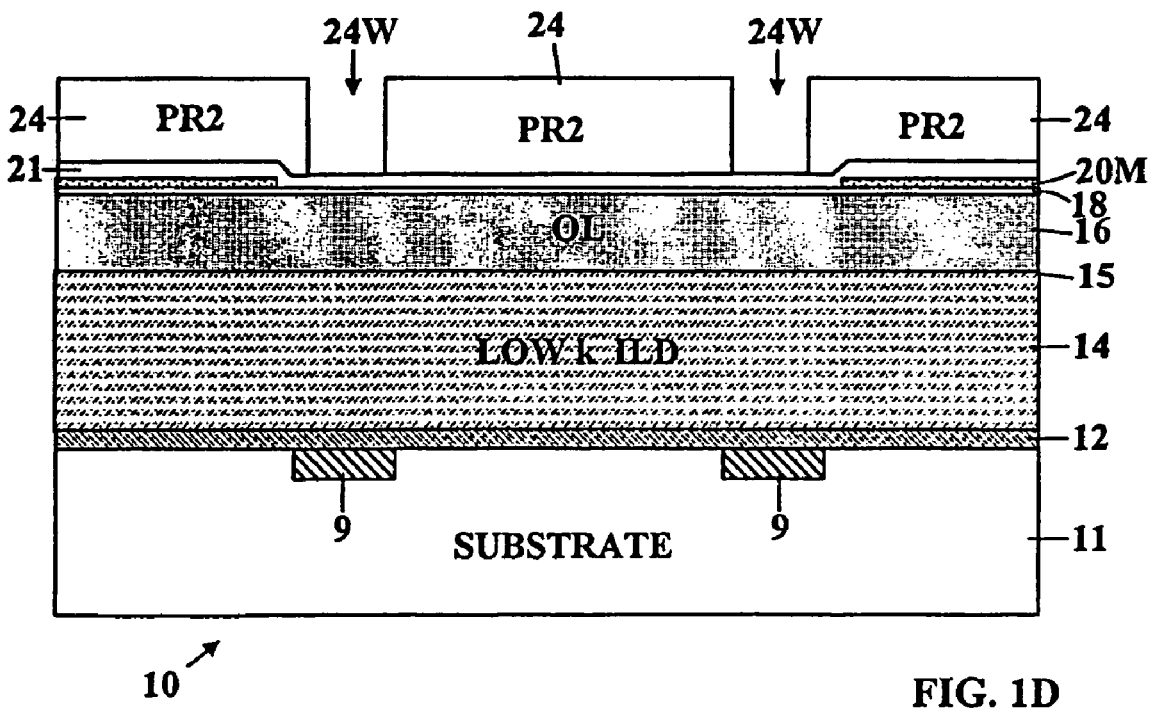
Figure 1E:
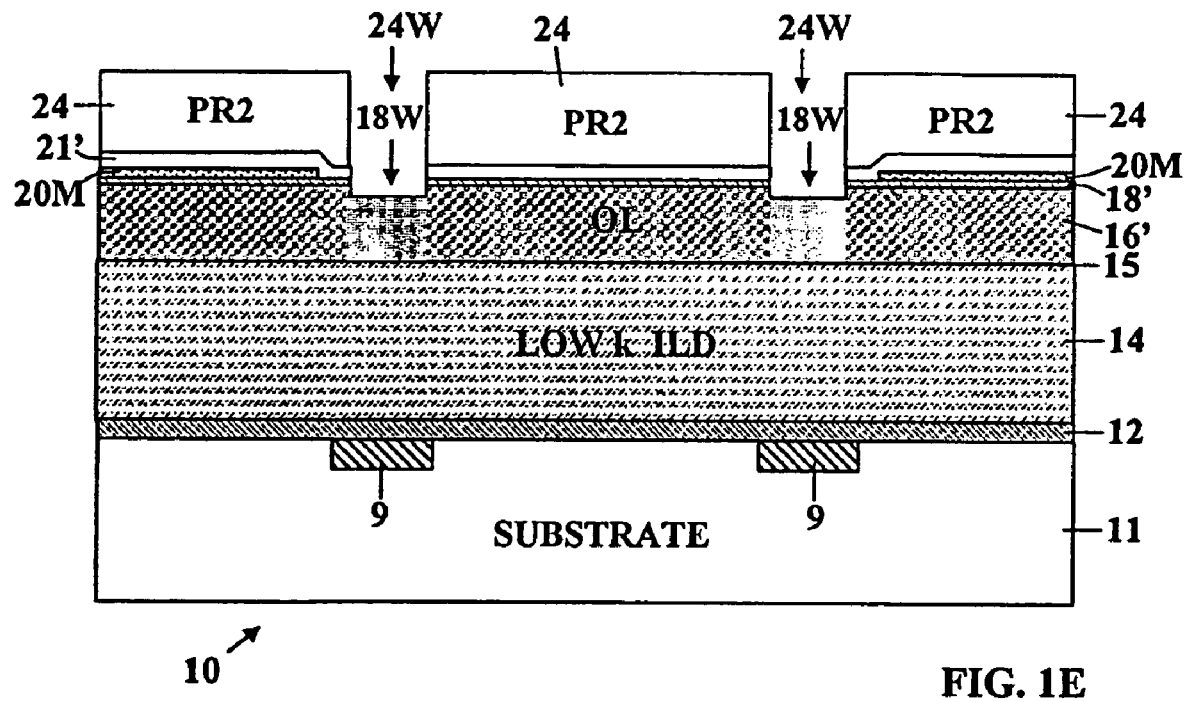
Figure 1F:
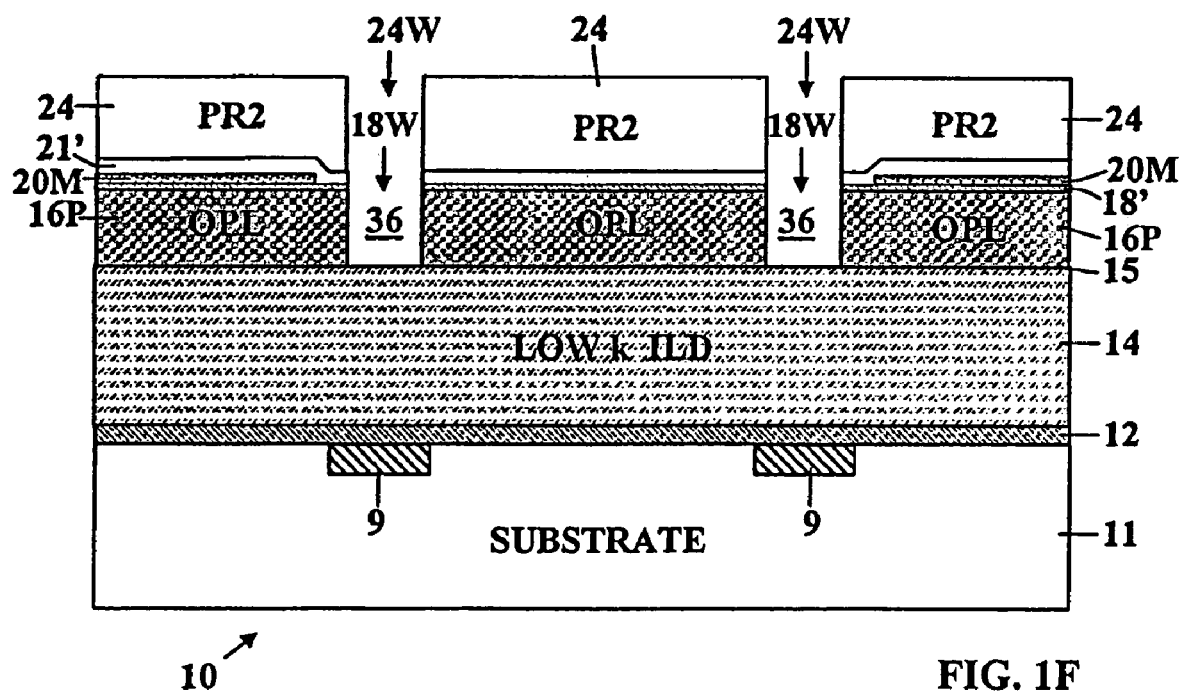
Figure 1G:
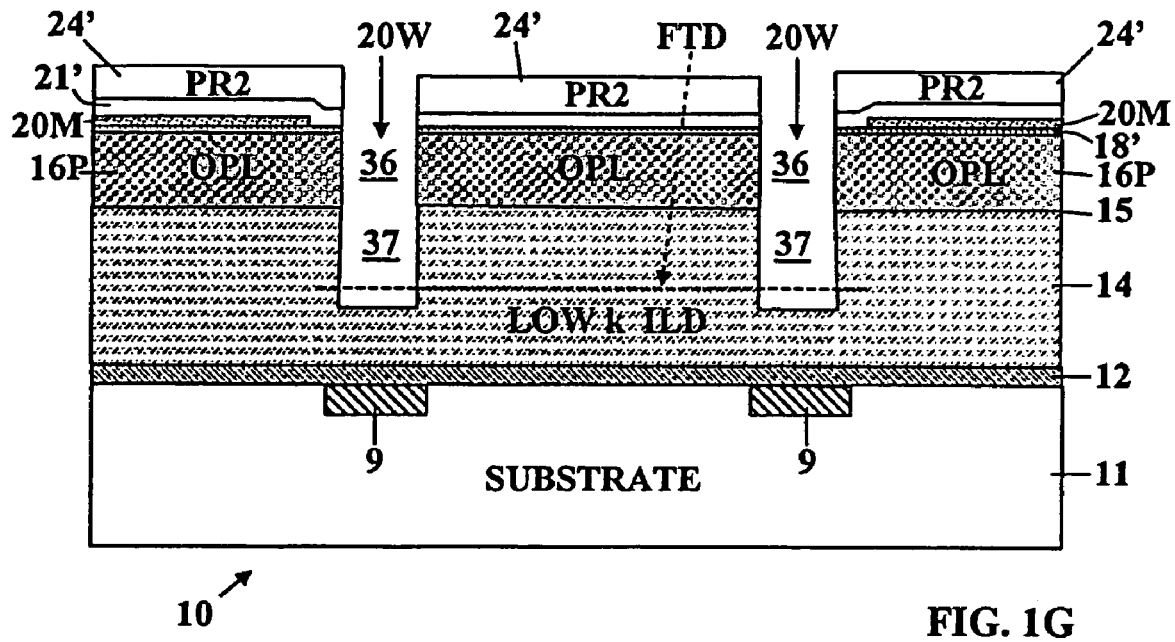
Figure 1H:
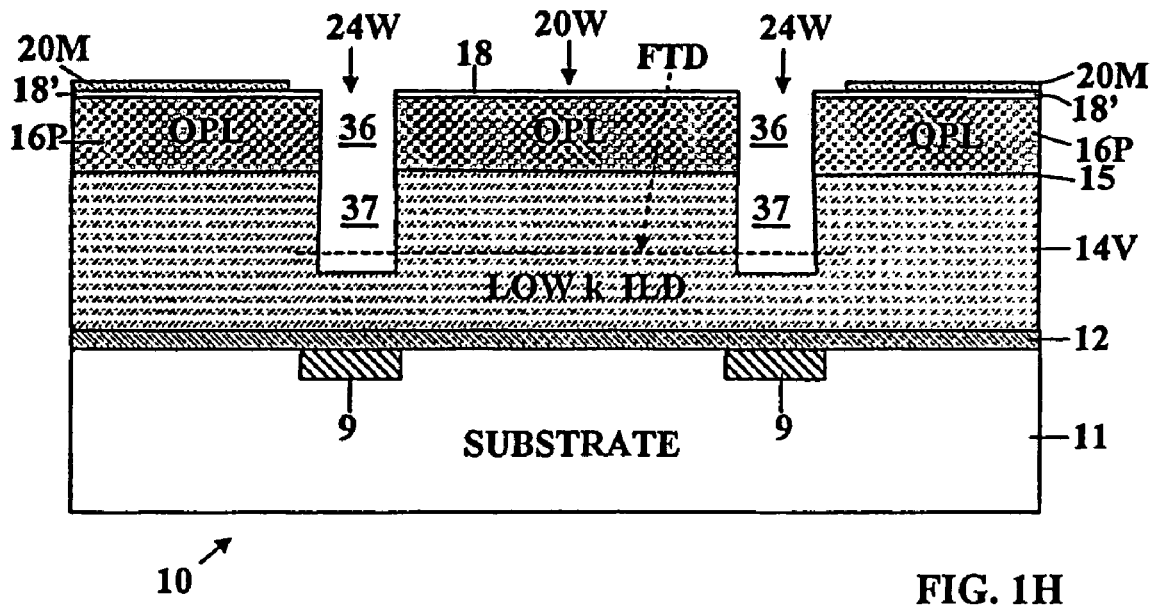
Figure 1I:
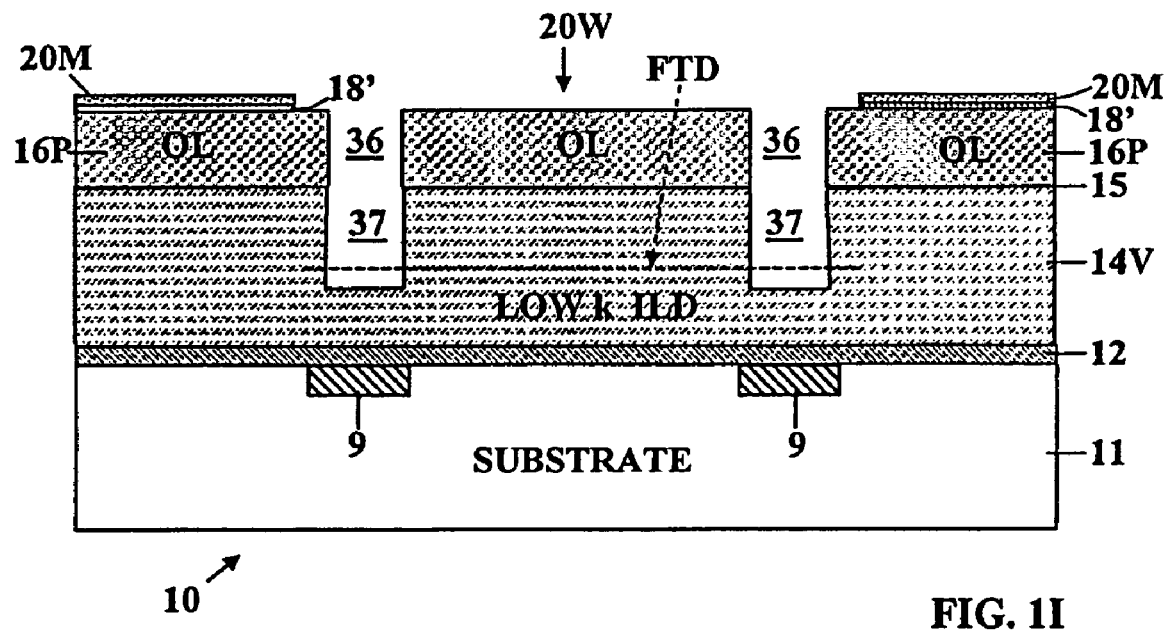
Figure 1J:
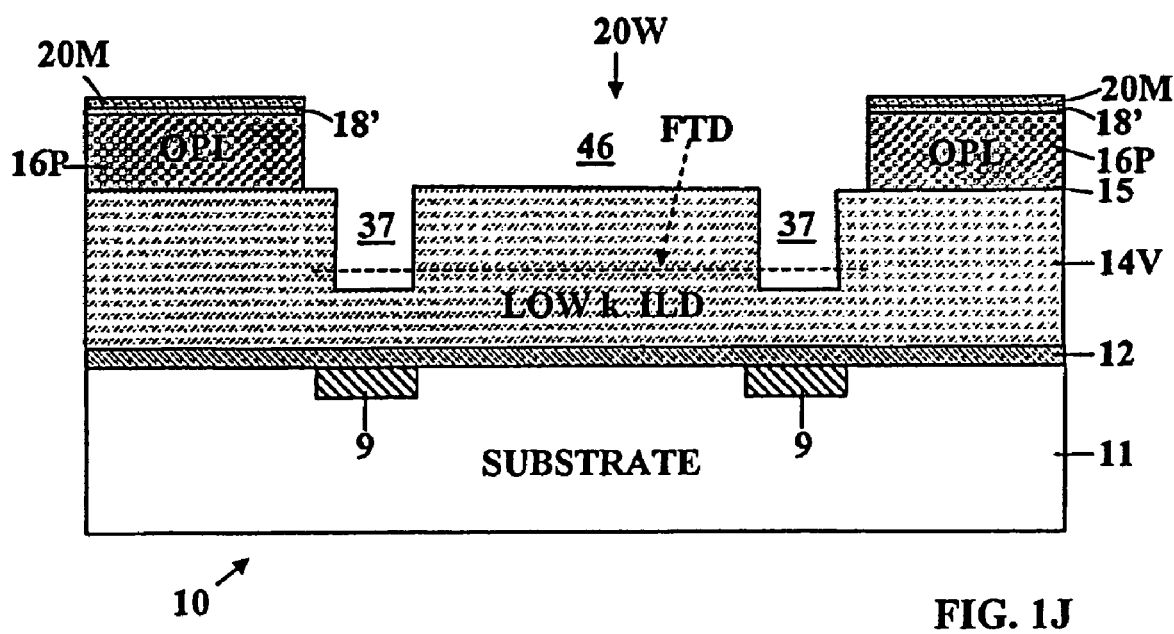
Figure 1K:
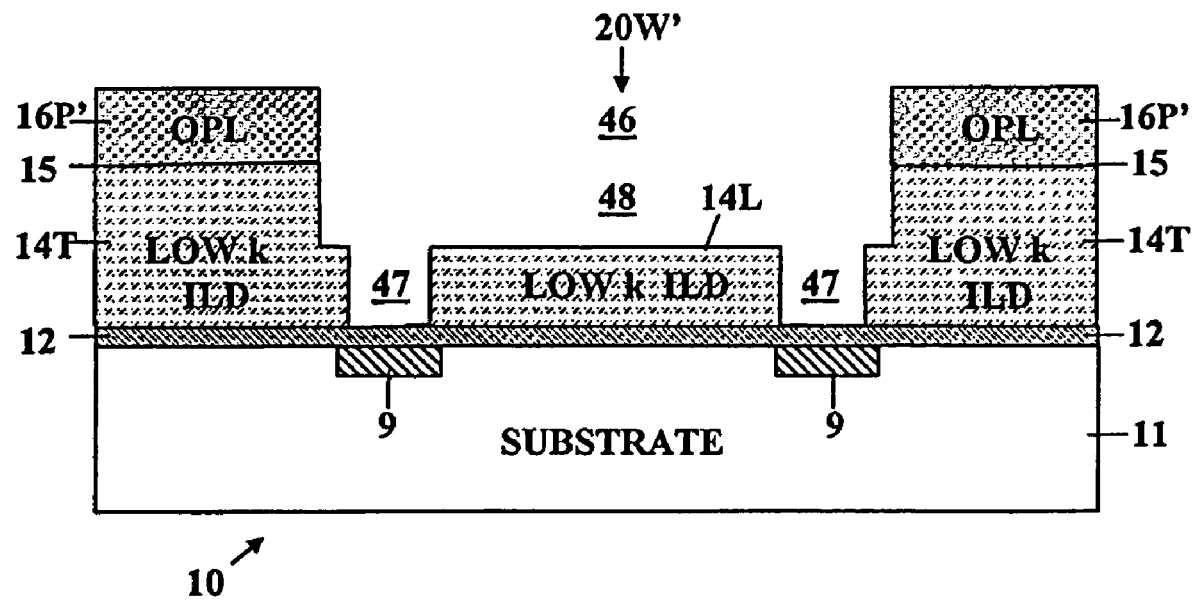
Figure 1L:
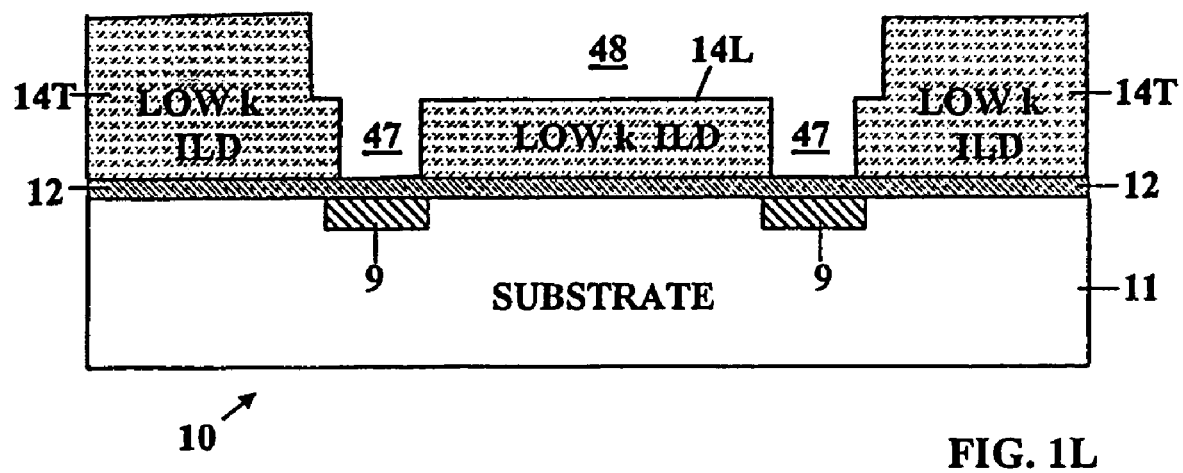
Figure 1M:
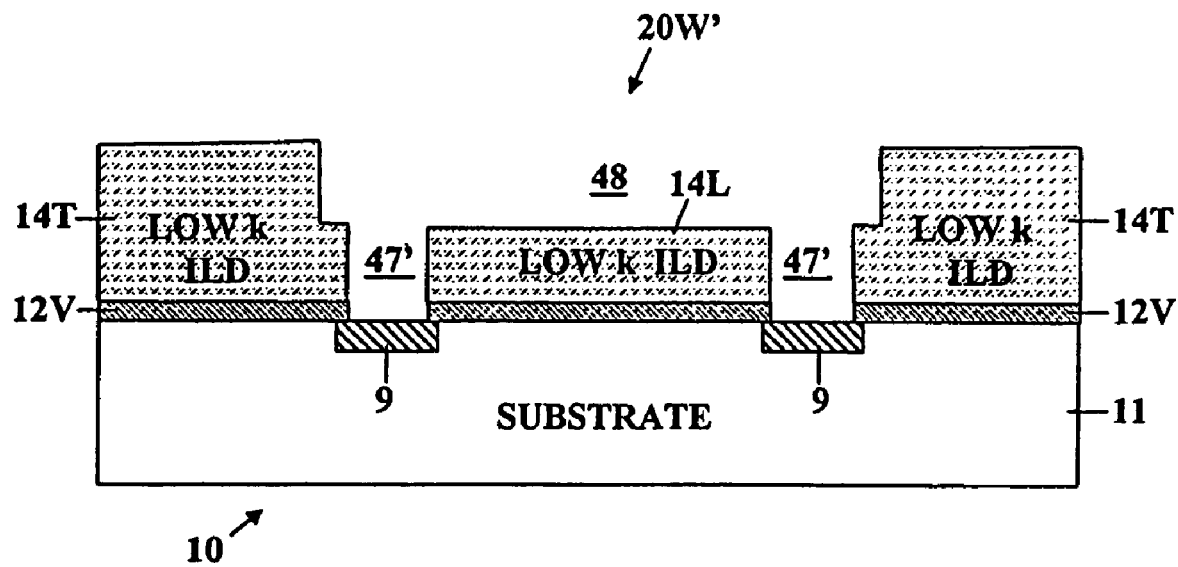
Figure 1N:
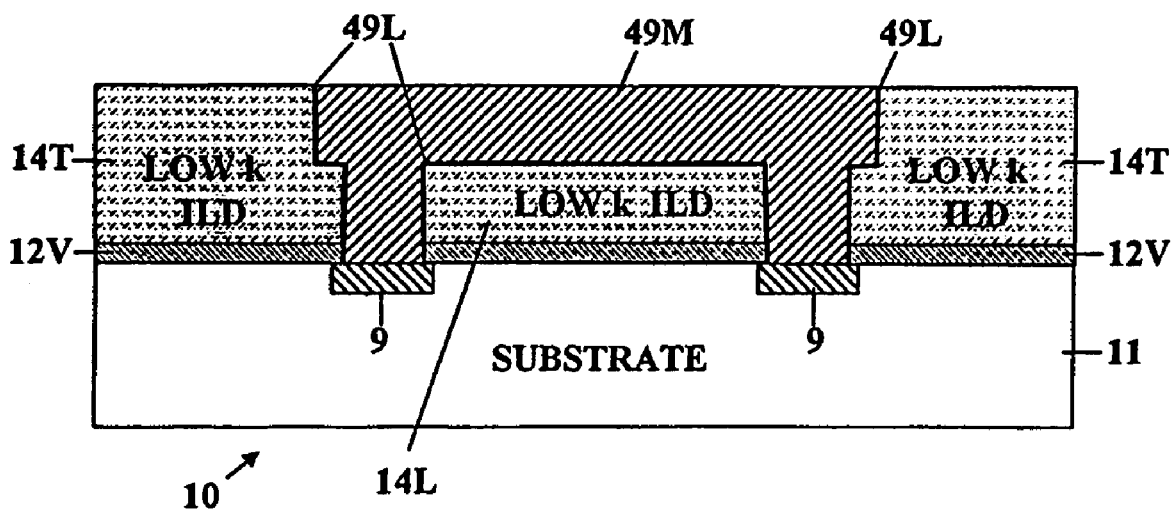

FIGS. 1A–1N illustrate a preferred embodiment of process of manufacture of a device in accordance with the method of this invention.

Referring to FIG. 1A shows a device 10 in an early stage of a method of manufacture in accordance with this invention. The device 10 is formed on a substrate 11 in which copper wiring conductors 9 are located in accordance with the state of the art. A thin cap layer 12, that covers the copper patterned substrate 11, is deposited thereon followed by formation an ILD layer 14 of the desired thickness (step 51 in the FIG. 2 flow chart).

Figure 2:
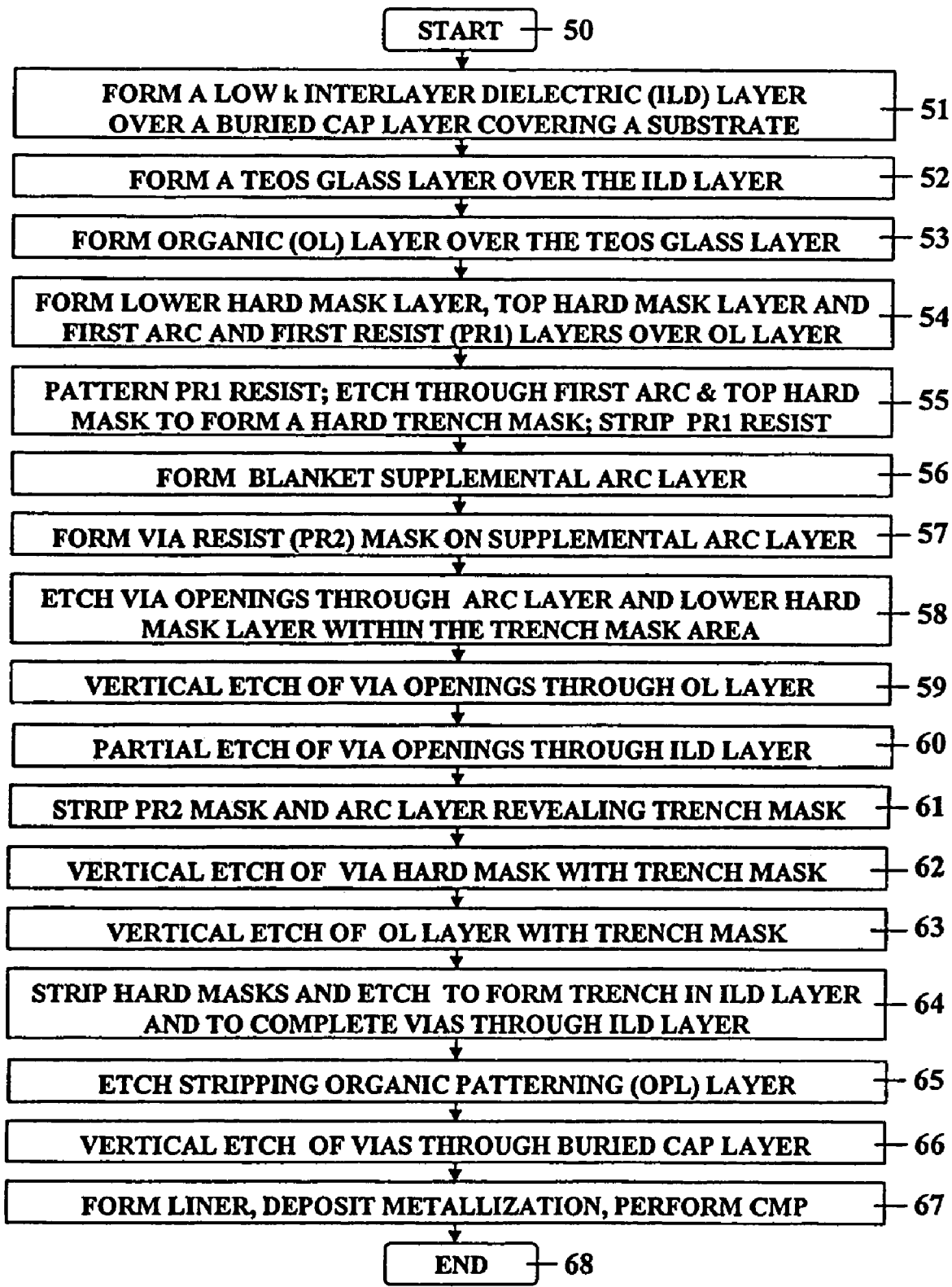
FIG. 2 is a flow chart showing the sequence of steps of the process illustrated by FIGS. 1A–1N.

Preferably, a thin TEOS glass film 15 is deposited over the ILD layer 14 (step 52 in the flow chart shown in FIG. 2).

The TEOS glass film 15 is covered by an organic (OL) layer 16 comprising a thermally stable organic polymer film of a predetermined thickness (step 53 in the FIG. 2).

The organic (OL) layer 16 may be composed of a material selected from organic polymer materials that can be applied to the ILD surface either through a spin-on process or through a CVD or PECVD process. The preferred characteristics of the OL layer 16 are thermal stability to at least 400° C. with minimal dimensional change during any required thermal cure stage. The OL must be etchable in a radio frequency (RF) plasma using combinations of hydrogen and nitrogen, oxygen and nitrogen, hydrogen and argon, and oxygen and argon.

FIG. 1B shows the device 10 of FIG. 1A after a blanket lower, via hard mask layer 18, a blanket top, trench hard mask layer 20, a blanket Anti-Reflective Coating (ARC) layer 21A and a blanket photoresist (PR1) layer 22A have been deposited over the OL layer 16 (step 54 in the flow chart shown in FIG. 2). Examples of a material which may comprise the lower, via hard mask layer 18 include silicon oxide, silicon nitride, silicon carbide, and nitrided silicon carbide. The thin top, trench hard mask layer 20 which covers the lower, via hard mask layer 18 is composed of a different material which can be etched selectively with respect thereto. The choice of the materials from which hard masking layers 18/20 are formed is determined by the etching requirements and composition and structure (porous or non-porous) of the ILD layer 14. The ARC layer 21A has been deposited in preparation for use of photolithographic patterning with the photoresist layer 22A.

Form a Hard Trench Mask

Referring to step 55 in the flow chart shown in FIG. 2, FIG. 1C shows the device 10 of FIG. 1B after the photoresist mask 22A has been patterned photolitho-graphically to form a first, trench patterning (PR 1) mask 22 over the ARC layer 21A for patterning the top, trench hard mask layer 20. The trench patterning mask 22 is patterned with a window 22W therethrough above the location where a trench 48 shown in FIG. 1L is to be formed in the ILD layer 14. The opening 22W through the first, trench patterning (PR1) mask 22 provides a trench pattern that has been used during anisotropic vertical etching through the ARC layer 21A and the top, trench hard mask layer 20 selectively exposing the top surface of the lower, via hard mask layer 18 to form a patterned ARC layer 21M, and a top, trench hard mask 20M with a window 20W therethrough. The window 20W in the ARC layer 21M and the window 20W through the top, trench hard mask 20M are formed where the trench 48 will be etched into the ILD layer 14. The trench 48 will be etched after several intervening steps directed to formation of the via openings 47/47' in FIGS. 1L and 1M that will be formed below the trench 48. The lower, via hard mask layer 18 serves as an etch stop when the top, trench hard mask layer 20 is being etched to form the top, trench hard mask 20M with the window opening 20W therethrough. At this point in the process, the etching that forms window 20W stops on or in the first deposited, lower, via bard mask layer 18.

EXAMPLE 1

After the OL layer 16 is deposited, the lower, via hard mask layer 18 of a thickness of about 35 nm of silicon oxide is deposited thereover. Over the lower, via hard mask layer 18, a second, toy, trench hard mask layer 20 composed of $Si_3N_4$ of a thickness of about 30 nm is deposited. The photoresist mask 22A and ARC layer 21A for trench definition are applied and developed and a plasma etch is used to etch the $Si_3N_4$ top, trench hard mask layer 20 and stop on or in the silicon oxide lower, via hard mask layer 18. Plasma etch conditions for this selective etch include an RF (Radio Frequency) system operating at 27 MHz and 2 MHz in a parallel plate configuration. Operating pressure is in the range of 30 to 60 mTorr and gases include Ar, $CHF_3$ or $CH_2F_2$, and CO with flows at 300 sccm, 30 sccm, 50 sccm and 200 sccm respectively. The amount of power applied to the electrodes is of the level of 350 watts and 100 watts for the 27 MHz and for the 2 MHz frequencies, respectively. Typical etch times are short and are of the order of less than 30 seconds. The transition of the etch of the top, trench hard mask 20M into the lower, via hard mask layer 18 can be monitored through optical emission spectroscopy providing real time control of the process.

EXAMPLE 2

After the OL layer 16 is deposited a lower hard mask layer 18 of a thickness of about 15 nm of silicon carbide is deposited. Over this layer the top hard mask layer 20 of $Si_3N_4$ of a thickness of about 30 nm is deposited. The photoresist 20A and ARC 21A for trench definition are applied and developed and plasma etch is used to etch the $Si_3N_4$ of the top hard mask layer 20 and stop on or in the silicon oxide of the lower hard mask layer 18. Plasma etch conditions for this selective etch include an RF system operating at 27 MHz and 2 MHz in a parallel plate configuration. Operating pressure is in the range of 30 to 60 mTorr and gases include Ar, $CF_4$ and $CHF_3$ and $O_2$ with flows at 300 sccm, 80 sccm, 30 sccm and 10 sccm respectively. The amount of power which is applied to the electrodes is of the level of 500 watts and 100 watts for the 27 MHz and for the 2 MHz frequencies, respectively. Typical etch times are short and are of the order of less than 50 seconds. The transition of the etch of the top hard mask into the lower hard mask can be monitored through optical emission spectroscopy providing real time process control.

Then the first (PR1) mask 22 is stripped in accordance with step 55 in FIG. 2.

FIG. 1D shows the device 10 of FIG. 1C after several additional steps have been performed. Initially, as indicated above, the first, photoresist mask 22 has been stripped. Then in step 56 in FIG. 2 a supplemental Anti-Reflection Coating (ARC) layer 21 has been formed as a blanket covering the top, trench hard mask layer 20 and the exposed portion of the lower, via hard mask layer 18.

Then in accordance with step 57 in FIG. 2, a photolithography step is used to form a via patterning (PR2) photoresist (resist) mask 24 above ARC layer 21. The via patterning resist mask 24 is shown with two via patterning windows 24W therethrough which expose the top surface of the ARC layer 21 where via openings 37/47 are to be formed in FIGS. 1G–1K. The photolithography step defines the location of the via patterning windows 24W which are typically located peripherally, i.e. proximate to the lateral ends/borders of trenches.

Initial Definition of Vias Through ARC and Hard Mask into Organic Layer

FIG. 1E shows the device 10 of FIG. 1D after step 58 in FIG. 2 has been performed in which the vias patterning windows 24W have been used to perform anisotropic, vertical and sequential etching, through the ARC layer 21, creating a patterned ARC layer 21'. Then the sequence of anisotropic etching continues through the lower, via hard mask layer 18 into the top portion of the organic (OL) layer 16 thereby forming a lower, via hard mask 18' with via windows 18W therethrough vertically aligned with the via patterning windows 24W. The etching chemistry employed to form the via windows 18W formed in the lower, via hard mask 18' can also etch some of the second mask 24, if it comprises photoresist.

Via RIE is Carried Out Through Organic Layer Down to ILD

FIG. 1F shows the device 10 of FIG. 1E after performance of the vertical etching step 59 in FIG. 2 which causes the organic (OL) layer 16 to be penetrated by vertical etching thereof through the via windows 18W forming an Organic Patterning Layer (OPL) 16P. In step 59 in FIG. 2, the RIE conditions were changed so that etching of the via patterning windows 24W through the organic (OL) layer 16 was completed forming a pair of OL via windows 36 therethrough. Along with the organic (OL) layer 16 being etched, the photoresist of the second mask 24 is preferably etched as well. The via etch of the organic (OL) layer 16 which becomes the Organic Patterning Layer (OPL) 16P is continued until the top surface of the ILD layer 14 is reached. It is desirable to remove the photoresist mask 24 and the patterned ARC layer 21' but is not essential.

The Organic Patterning Layer (OPL) 16 can be readily etched in a Radio Frequency (RF) plasma with gases such as hydrogen and nitrogen, nitrogen and oxygen, or argon and oxygen as examples. Etching of the siloxane dielectrics is most commonly carried out with an RF plasma using gases having a fluorocarbon, e.g. $C_4F_8$, $C_5F_6$, $C_5F_8$, $CF_4$, $CHF_3$, $CH_2F_2$, $CF_3F$, with argon, nitrogen, carbon dioxide and oxygen.

Via Etch Through Part of the ILD Thickness

FIG. 1G shows the device 10 of FIG. 1F after step 60 in FIG. 2 in which shallow via holes 37 are partially etched through the ILD layer 14 forming a via patterned ILD layer 14V below OL via windows 36. The RIE conditions have been changed to etch the shallow via holes 37 into the ILD and continue until the vias have been etched to an appropriate depth based on the later steps. Typically, the RIE conditions for etching the shallow via holes 37 in the ILD layer 14 are very different from those employed for etching the material of OPL layer 16P which is etched at a rate substantially slower than the material of the ILD layer 14. A horizontal indicates the Final Trench Depth line (FTD) final depth of the trench 48 in the device 10 in FIGS. 1K–1M.

The choice of etching gases for vertically etching through the ILD layer 14 is determined by the compositions of the ILD layer 14 and the lower, via hard mask layers 18'. The etching of the shallow vias 37 is to be sufficiently selective to the via, hard mask film 18'. Some situations may be best executed with a residual thickness of the photoresist and the ARC layer 21' to also aid in maintaining the trench hard mask pattern.

The depth of the partially etched via at this point is determined by the deposited thickness of the ILD layer 14 and its relative rate of etching during the etching of the OL layer 16. If the ILD layer 14 does not etch during the etching of the OL layer 16, RIE the vias are etched to at least the FTD depth of the trench in the ILD layer 14. If the ILD layer 14 etches somewhat during the organic trench etch definition step as shown in FIG. 1E, then the via partial RIE is reduced accordingly. In all cases the depth of the partial etch is greater than more than half the thickness of the ILD layer 14.

After Via Partial RIE is Completed Remove any Remaining Resist/ARC

FIG. 1H shows the device 10 of FIG. 1G after step 61 in FIG. 2 in which the PR2 second photoresist mask 24' has been stripped and ARC layer 21' has been removed exposing the trench hard mask 20M and surfaces of the lower, via hard mask 18' inside with window 20W through the trench hard mask 20M. The additional etch of the PR2 resist 24' and the ARC layer 21' is only needed if the OL layer 16P is thinner than the PR2 resist 24' and the ARC layer 21'.

FIG. 1I shows the device 10 of FIG. 1H after step 62 in FIG. 2 compromising performing a vertical etch of the exposed portions of the lower, via hard 18' through the window 20W through the top, trench hard mask 20M. In other words. FIG. 1I shows device 10 after the top, trench hard mask 20M was exposed in FIG. 1H and after a vertical, anisotropic etch has been performed removing exposed portions of the lower, via hard mask 18', thereby producing a trench patterning window 20W through the top, trench hard mask 20M, exposing the top surface of the OL layer 16P in the defined trench area.

RIE of Organic Layer Translating the Trench Pattern to the ILD

FIG. 1J shows the device 10 of FIG. 1I after step 63 in FIG. 2 through which an OPL trench window 46 has been formed in the OL layer 16P below the trench patterning window 20W an the top, hard trench mask 20M. The portion of the OL layer 16P below window 20W has been etched away by an RIE a vertical etch to form an Organic Patterning Layer 16P surrounding the OPL trench window 46. The vertical etch through the OL layer 16 continues down to the top surface of the ILD layer 14V below, the hard trench mask 20M. The portion of the OL layer 16P below window 20W has been etched away by RIE performing a vertical etch to form an Organic Patterning Layer 16P surrounding the OPL trench window 46. The vertical etch through the OL layer 16 continues down to the top surface of the ILD layer 14V below.

Trench RIE to FTD and Via Completion RIE to Cap Layer

FIG. 1K shows the device 10 of FIG. 1J after step 64 in FIG. 2 in which the top hard mask 20M and and lower mask 18' have been stripped or etched away followed by formation of the trench feature 48 below the OPL trench window 46, as described next. The etch process is again changed hack to a composition and condition so that the ILD layer 14V is again etched to form the trench feature 48 in the ILD layer 14T to the Final Trench Depth line (FTD) final depth of the trench 48. At this stage in the process both the via holes 47 and trench feature 48 are etched and the process is continued until the trench depth is at its desired level FTD indicated in FIG. 1J, inter alia. During this time the via holes 47 are also completely etched to top surface of the cap layer 12 below. As the hard mask layers have been etched away only the organic patterning layer (OPL) 16P' remains on the ILD stack FIG. 1L shows the device 10 of FIG. 1K after step 65 in FIG. 2 in which the organic patterning layer (OPL) 16P' is stripped away.

Trench and vias completed after organic layer strip and cap open RE step.

FIG. 1M shows the device 10 of FIG. 1L after step 66 in FIG. 2 in which the via holes 47' are formed reaching to the top surface of the substrate 11 and exposing the top surface of the buried conductors 9 by etching through the top surface of the cap layer 12 under the via hole 47 to reach down therethrough to the substrate 11. That completes the preparation of the trench 48 and via holes 47' for the dual Damascene process.

Alternately, the exposed via portion of the cap can be etched away before the stripping of the OPL layer 16P'. In such a sequence, the OPL would be removed after the cap layer is opened and the metal level below exposed.

FIG. 1N shows the device 10 of FIG. 1M after completion of the process of this invention and continuing to form a dielectric liner layer 49L and filling with deposition of conductor metal 49M in contact with the buried conductors 9, followed by CMP to complete this level of metallization of FIGS. 1A–1M. The total process is repeated for each additional level needed.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the following claims.

The invention is claimed is:

1. A method of forming a dual damascene conductor structure comprising:
   providing a substrate having a top surface with an electrical conductor exposed on said top surface;
   forming a cap layer having a bottom surface located above said top surface of said substrate;
   forming a dielectric layer having a bottom surface located above said cap layer;
   forming an organic (OL) layer over said dielectric layer;
   forming a lower, via hard mask layer and a tap, trench hard mask layer over said OL layer;
   forming a trench patterning hole through said top, trench hard mask layer;
   forming a via patterning hole through said lower, via hard mask layer inside said trench patterning hole through said top, trench hard mask layer;
   etching said via patterning hole through said organic layer and then etching said via patterning hole into said dielectric layer;
   etching away said via hard mask layer below said trench patterning hole and then etching away said OL layer below said trench patterning hole;
   etching said via hole through said bottom of said dielectric layer to said cap layer while partially etching a trench into said dielectric layer below said trench patterning hole with said trench having a bottom and sidewalls in said dielectric layer with said bottom being spaced above said cap layer; and
   etching through said cap layer below said via hole to expose said conductor.

2. The method of claim 1 wherein a buried cap layer is formed between said substrate and said dielectric layer.

3. The method of claim 1 wherein a glass layer is formed over said OL layer.

4. The method of claim 1 wherein said dielectric layer is a low k Inter-Layer Dielectric (ILD) layer.

5. The method of claim 1 wherein said OL layer comprises an organic polymer with thermal stability to 400° C. or greater and said OL layer is etchable by a radio frequency (RF) plasma process using $H_2/N_2$, $O_2/N_2$, $H_2/Ar$, or $O_2/Ar$.

6. The method of claim 1 wherein:
   a buried cap layer is formed between said substrate and said dielectric layer; and
   a glass layer is formed over said OL layer.

7. The method of claim 1 wherein:
   a buried cap layer is formed between said substrate and said dielectric layer;
   a glass layer is formed over said OL layer; and
   said dielectric layer is a low k Inter-Layer Dielectric (ILD) layer.

8. The method of claim 1 wherein:
   said OL layer comprises an organic polymer with thermal stability to 400° C. or greater and said OL layer is etchable by a radio frequency (RF) plasma process using $H_2/N_2$, $O_2/N_2$, $H_2/Ar$, or $O_2/Ar$;
   said buried cap layer is formed between said substrate and said dielectric layer;
   a glass layer is formed over said OL layer; and
   said dielectric layer is a low k Inter-Layer Dielectric (ILD) layer.

9. The method of claim 1 wherein said trench is etched to a Final Trench Depth line (FTD) in said dielectric layer.

10. The method of claim 1 wherein:
said OL layer comprises an organic polymer with thermal stability to 400° C or greater and said OL layer is etchable by a radio frequency (RF) plasma process using $H_2/N_2$, $O_2/N_2$, $H_2/Ar$, or $O_2/Ar$;
said buried cap layer is formed between said substrate and said dielectric layer;
a glass layer is formed over said OL layer;
said dielectric layer is a low k Inter-Layer Dielectric (ILD) layer; and
said trench is etched to a Final Trench Depth line (FTD) in said dielectric layer.

11. A method of forming a dual damascene conductor structure comprising:
providing a substrate having a top surface with an electrical conductor exposed on said top surface, with a buried cap layer covering said top surface and said conductor; and forming a dielectric layer having a bottom surface located above said top surface of said substrate;
forming a glass layer over said dielectric layer and forming an organic (OL) layer over said glass layer;
forming a via hard mask layer over said organic layer;
forming a trench patterning hard mask layer over said via hard mask layer;
forming a trench patterning hole through said trench patterning hard mask layer exposing portions of said via hard mask layer;
forming a via patterning hole through said via hard mask layer exposed through trench patterning hole through said trench patterning hard mask layer;
etching through said via patterning hole to etch a via hole through said organic (OL) layer and then etching through said via patterning hole to etch said via hole into said dielectric layer;
etching away said via hard mask layer below said trench patterning hole and then etching away exposed portions of said organic(OL) layer below said trench patterning hole;
etching said via hole through said bottom of said dielectric layer exposing said cap layer while partially etching a trench into said dielectric layer below said trench patterning hole with said trench having sidewalls and a bottom in said dielectric layer, with said bottom being at a final trench depth spaced above said cap layer;
etching through said cap layer below said via hole to expose said conductor; and
forming a dielectric liner layer on sidewalls of said trench and forming a conductor inside said sidewalls in said trench.

12. The method of claim 11 wherein said dielectric layer is a low k Inter-Layer Dielectric (ILD) layer.

13. The method of claim 11 wherein said CL layer comprises an organic polymer with thermal stability to 400° C. or greater and said OL layer is etchable by a radio frequency (RF) plasma process using $H_2/N_2$, $O_2/N_2$, $H_2/Ar$, or $O_2/Ar$.

14. The method of claim 11 wherein said trench is etched to a Final Trench Depth line (FTD) in said dielectric layer.

15. The method of claim 11 wherein:
said OL layer comprises an organic polymer with thermal stability to 400° C. or greater;
said OL layer is etchable by a radio frequency (RF) plasma process using $H_2/N_2$, $O_2/N_2$, $H_2/Ar$, or $O_2/Ar$; and
said trench is etched to a Final Trench Depth line (FTD) in said dielectric layer.

16. The method of claim 11 wherein an ARC layer is formed below a photoresist layer when patterning said via hard mask layer and said trench patterning hard mask layer.

17. The method of claim 11 wherein:
said dielectric layer is a low k Inter-Layer Dielectric (ILD) layer; and
said OL layer comprises an organic polymer with thermal stability to 400° C. or greater; and
said OL layer is etchable by a radio frequency (RF) plasma process using $H_2/N_2$, $O_2/N_2$, $H_2/Ar$, or $O_2/Ar$.

18. The method of claim 11 wherein:
said dielectric layer is a low k Inter-Layer Dielectric (ILD) layer;
said OL layer comprises an organic polymer with thermal stability to 400° C. or greater;
said OL layer is etchable by radio frequency (RF) plasma process using $H_2/N_2$, $O_2/N_2$, $H_2/Ar$, or $O_2/Ar$; and
said trench is etched to a Final Trench Depth line (FTD) in said dielectric layer.

19. The method of claim 11 wherein:
said dielectric layer is a low k Inter-Layer Dielectric (ILD) layer;
said OL layer comprises an organic polymer with thermal stability to 400° C. or greater;
said OL layer is etchable by a radio frequency (RF) plasma process using $H_2/N_2$, $O_2/N_2$, $H_2/Ar$, or $O_2/Ar$; and
said trench is etched to a Final Trench Depth line (FTD) in said dielectric layer.

20. The method of claim 11 wherein:
an ARC layer is formed below a photoresist layer when patterning said via hard mask layer and said trench patterning hard mask layer; and
said ARC layer and said trench patterning hard mask layer are removed prior to etching said trench in said dielectric layer.

* * * * *